(12) United States Patent
Aso et al.

(10) Patent No.: US 8,574,447 B2
(45) Date of Patent: Nov. 5, 2013

(54) INORGANIC RAPID ALTERNATING PROCESS FOR SILICON ETCH

(75) Inventors: Tsuyoshi Aso, Tokyo (JP); Camelia Rusu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 436 days.

(21) Appl. No.: 12/751,635

(22) Filed: Mar. 31, 2010

(65) Prior Publication Data

US 2011/0244686 A1   Oct. 6, 2011

(51) Int. Cl.
*B44C 1/22* (2006.01)

(52) U.S. Cl.
USPC ............... 216/67; 216/37; 438/696; 438/701; 438/944

(58) Field of Classification Search
USPC .................. 216/37, 67; 438/696, 701, 944
See application file for complete search history.

(56) References Cited

U.S. PATENT DOCUMENTS

| | | | |
|---|---|---|---|
| 4,784,720 A * | 11/1988 | Douglas ........................ | 438/695 |
| 5,501,893 A | 3/1996 | Laermer et al. | |
| 6,380,095 B1 | 4/2002 | Liu et al. | |
| 6,531,068 B2 | 3/2003 | Laermer et al. | |
| 6,743,727 B2 * | 6/2004 | Mathad et al. ................ | 438/695 |
| 6,780,337 B2 | 8/2004 | Goldbach et al. | |
| 6,821,900 B2 * | 11/2004 | Athavale et al. .............. | 438/700 |
| 2002/0179570 A1 | 12/2002 | Mathad et al. | |
| 2005/0048785 A1 * | 3/2005 | Kang et al. .................... | 438/696 |
| 2007/0026677 A1 | 2/2007 | Ji | |

FOREIGN PATENT DOCUMENTS

WO    WO 2011/126621    10/2011

OTHER PUBLICATIONS

International Search Report dated Nov. 14, 2011, from International Application No. PCT/US2011/026509.
Written Opinion dated Nov. 14, 2011, from International Application No. PCT/US2011/026509.

* cited by examiner

*Primary Examiner* — Duy Deo
*Assistant Examiner* — Maki Angadi
(74) *Attorney, Agent, or Firm* — Beyer Law Group LLP

(57) ABSTRACT

A method for etching features into a silicon substrate disposed below a mask in a plasma processing chamber is provided. The silicon substrate is etched through the mask comprising a plurality of cycles, wherein each cycle comprises a sidewall deposition phase and an etch phase. The sidewall deposition phase comprises providing a flow of sidewall inorganic deposition phase gas comprising a silicon containing compound gas and at least one of oxygen, nitrogen or $NO_x$, into the plasma processing chamber, forming a plasma from the sidewall deposition phase gas in the plasma processing chamber, and stopping the flow of the sidewall deposition gas into the plasma processing chamber. The etch phase comprises, providing a flow of an etching gas comprising a halogen component, forming a plasma from the etching gas in the plasma processing chamber, and stopping the flow of the etching gas.

20 Claims, 5 Drawing Sheets

INORGANIC RAPID ALTERNATING PROCESS FOR SILICON ETCH

BACKGROUND OF THE INVENTION

1. Field of the Invention

The invention relates to a method of obtaining a structure on a semiconductor wafer by etching a silicon layer through a mask.

2. Description of the Related Art

Silicon semiconductors containing silicon (Si) vias and Si trenches are used in a variety of technologies, from imaging products and memory to high-speed logic and high voltage device products. One emerging technology that relies heavily on vias formed through silicon semiconductor wafers (TSVs) is a three dimensional (3D) integrated circuit (IC). 3D ICs are created by stacking thinned semiconductor wafer chips and interconnecting them with through-silicon vias (TSVs). Another emerging technology that relies on trenches engraved into silicon semiconductor wafers (Si deep trenches) are power devices.

SUMMARY OF THE INVENTION

To achieve the foregoing and in accordance with the purpose of the present invention, a method for etching features into a silicon substrate, such as a crystalline silicon wafer or polysilicon, disposed below a mask in a plasma processing chamber is provided. The silicon substrate is etched through the mask comprising a plurality of cycles, wherein each cycle comprises a sidewall deposition phase and an etch phase. The sidewall deposition phase comprises providing a flow of sidewall deposition phase gas comprising a silicon containing compound gas and at least one of oxygen, nitrogen or $NO_x$, wherein x=1, 2 into the plasma processing chamber, forming a plasma from the sidewall deposition phase gas in the plasma processing chamber, and stopping the flow of the sidewall deposition gas into the plasma processing chamber. The etch phase comprises providing a flow of an etching gas comprising a halogen component into the plasma processing chamber, forming a plasma from the etching gas in the plasma processing chamber, and stopping the flow of the etching gas into the plasma processing chamber.

In another manifestation of the invention, a method for etching features into a silicon substrate disposed below a mask in a plasma processing chamber is provided. The silicon substrate through the mask comprising at least 10 cycles, wherein each cycle comprises a sidewall deposition phase and an etch phase. The sidewall deposition phase comprises providing a flow of sidewall deposition phase gas comprising a silane gas and at least one of oxygen, nitrogen or $NO_x$, wherein x=1, 2 into the plasma processing chamber, forming a plasma from the sidewall deposition phase gas in the plasma processing chamber, and stopping the flow of the sidewall deposition gas into the plasma processing chamber. The etch phase comprises providing a flow of an etching gas comprising $SF_6$ into the plasma processing chamber, forming a plasma from the etching gas in the plasma processing chamber, and stopping the flow of the etching gas into the plasma processing chamber.

In another manifestation of the invention, an apparatus for selectively etching a silicon substrate disposed below a mask is provided. A plasma processing chamber is provided comprising a chamber wall forming a plasma processing chamber enclosure, a substrate support for supporting a wafer within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises a silicon containing compound gas source, an oxygen, nitrogen, or $NO_x$ gas source, and a halogen component gas source. A controller is controllably connected to the gas source and the at least one electrode and comprises at least one processor and computer readable media. The computer readable media comprises computer readable code for etching the silicon substrate through the mask comprising a plurality of cycles, wherein each cycle comprises: computer readable code for providing a sidewall deposition phase, comprising computer readable code for providing a flow of sidewall deposition phase gas comprising a silicon containing compound gas from the silicon containing compound gas source and at least one of oxygen, nitrogen or $NO_x$, wherein x=1, 2 from the oxygen, nitrogen or $NO_x$ gas source into the plasma processing chamber, computer readable code for forming a plasma from the sidewall deposition phase gas in the plasma processing chamber, and computer readable code for stopping the flow of the sidewall deposition gas into the plasma processing chamber, and computer readable cod for providing an etch phase, comprising computer readable code for providing a flow of an etching gas comprising a halogen component from the halogen component gas source into the plasma processing chamber, computer readable code for forming a plasma from the etching gas in the plasma processing chamber, and computer readable code for stopping the flow of the etching gas into the plasma processing chamber.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In etching through Si Vias (TSVs) and Si deep trenches the most commonly used process is the Bosch process. In a Bosch process, a $C_4F_8$ deposition step and a $SF_6$ etch step are alternated. In the $C_4F_8$ deposition step, an organic polymer layer is deposited, so that sidewalls of the vias (and trenches) are protected. In the $SF_6$ etch step, Si is etched by $SF_6$ to form via or trench profiles. The etch rate is proportional to etch pressure, $SF_6$ flow, and etch time. A problems is that the sidewall organic polymer protection formed by $C_4F_8$ does not hold when any of the etch factors are increased. As a result, there is a significant trade off between bow profile and tapered profile. This trade off is even more pronounced when relatively high aspect ratio features are etched.

TSVs and Si deep trenches with low aspect ratios are etched using steady state processes. An $SF_6$ and $O_2$ mixture is commonly used in steady state TSVs and Si deep trench etches. In TSVs the Si deep trench etches, $O_2$ reacts with feature sidewall silicon forming silicon oxide, so the sidewalls are protected and the bowing profile is minimized. In addition, adequate $O_2$ works to increase etch rate, because Si and $O_2$ interactions enhance SiF gas formation. Using too much $O_2$ is detrimental, since it oxidizes the sidewalls and therefore the process is moved closer to etch stop.

Figure 1:
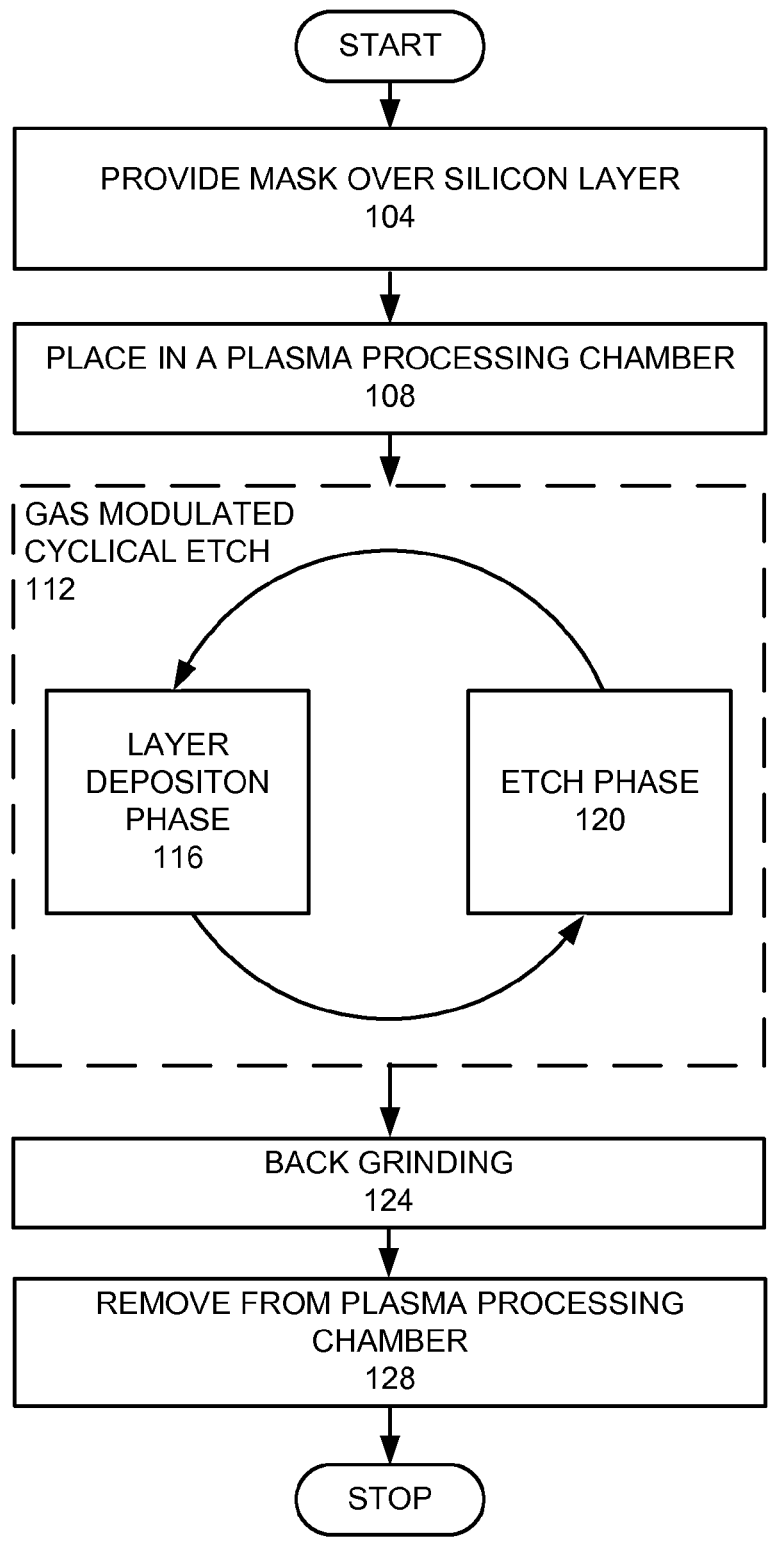
FIG. 1 is a flow chart of an embodiment of the invention.

FIG. 1 is a high level flow chart of an embodiment of the invention. In this embodiment, a patterned mask, such as a photoresist, is formed over a silicon layer (step 104). The silicon wafer is placed in a plasma processing chamber (step 108). The silicon layer is subjected to a gas modulated cyclical etch (step 112). The gas modulated cyclical etch comprises a plurality of cycles, where each cycle comprises a layer deposition phase (step 116) and an etch phase (step 120). The layer deposition phase uses a deposition gas comprising silicon compound and at least another gas containing oxygen, nitrogen or $NO_x$, wherein x=1, 2, or 3. The silicon compound is a silicon containing gas species. The etch phase contains compounds that etch silicon. The mask is then stripped (step 124). The wafer is then removed from the plasma processing chamber (step 128).

Figure 2A:
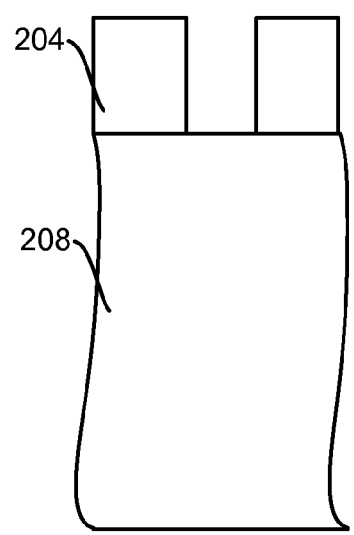
FIGS. 2A-D are schematic views of the formation of a feature using the inventive process.

In an example of an embodiment of the invention, the features to be etched are through semiconductor wafer vias (TSVs). In this example, the mask is a photoresist mask patterned on a silicon wafer (step 104). The mask can be either organic (as is the photoresist) or inorganic (e.g. oxide materials, silicon nitride etc). FIG. 2A is a schematic cross-sectional view of a silicon wafer 208, over which a patterned organic mask 204 has been form. One or more intermediate patterning layers, such as an antireflective coating (ARC) may be disposed between the silicon wafer (substrate) 208 and the patterned organic mask 204 to improve the mask patterning process.

Figure 3:
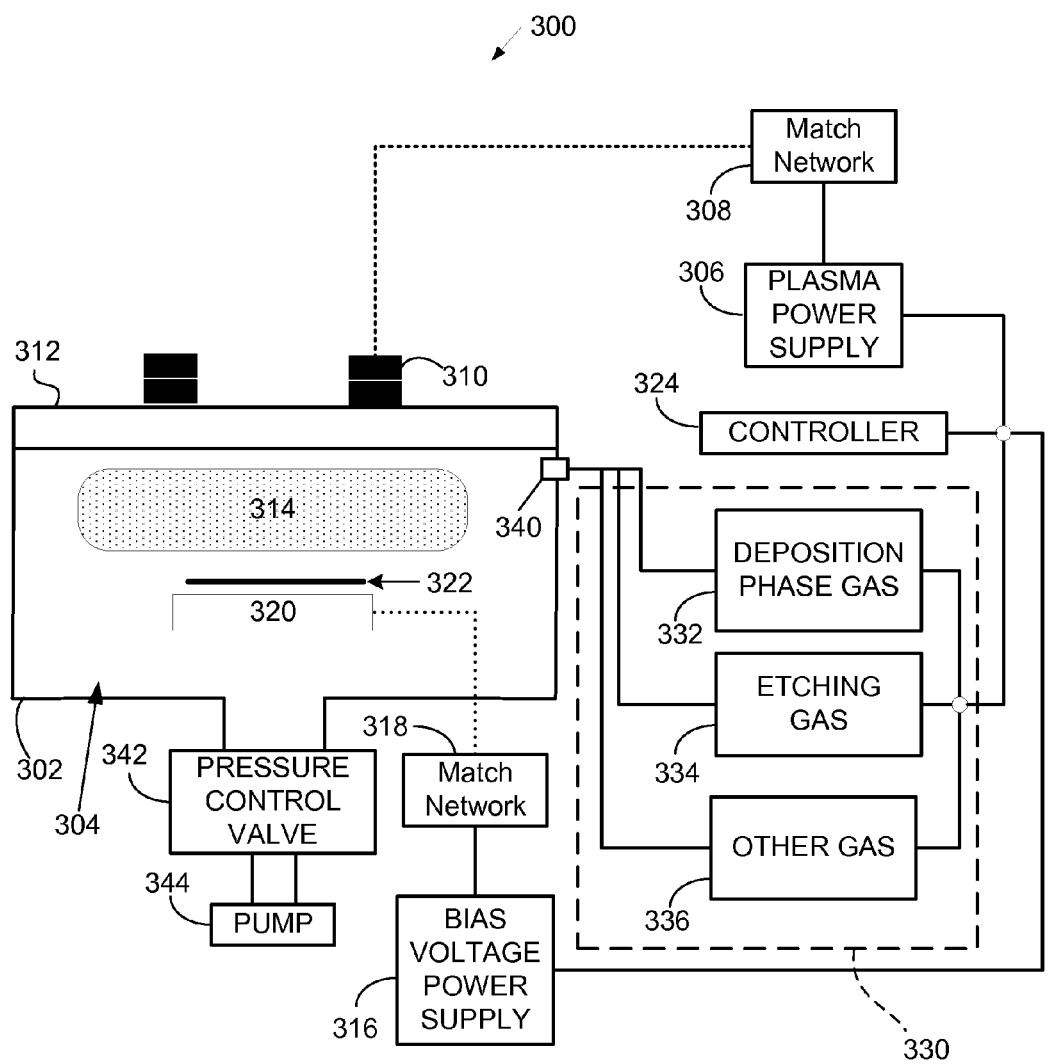
FIG. 3 is a schematic view of a plasma processing chamber that may be used in an embodiment of the invention.

The silicon wafer 208 is placed in a processing tool (step 108). FIG. 3 schematically illustrates an example of a plasma processing system 300 which may be used to perform the process of etching a silicon wafers in accordance with one embodiment of the present invention. The plasma processing system 300 includes a plasma reactor 302 having a plasma processing chamber 304 therein. A plasma power supply 306, tuned by a match network 308 supplies power to a TCP coil 310 located near a window 312 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on a wafer 322 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 100 to 10000 Watts, and the wafer bias voltage power supply 316 may supply a bias voltage of in a range of 10 to 1000 V. In addition, the TPC coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a deposition phase gas source 332, an etch phase gas source 334, and optionally, an additional gas source 336. The gas sources 332, 334, and 336 are in fluid connection with processing chamber 304 through a gas inlet 340. The gas inlet 340 may be located in any advantageous location in chamber 304, and may take any form for injecting gas, such as a single nozzle or a showerhead. Preferably, however, the gas inlet 340 may be configured to produce a "tunable" gas injection profile, which allows independent adjustment of the respective flow of the gases to multiple zones in the process chamber 304. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324. A 2300 Syndion by Lam Research Corp. may be used to practice an embodiment of the invention.

Figure 4A:
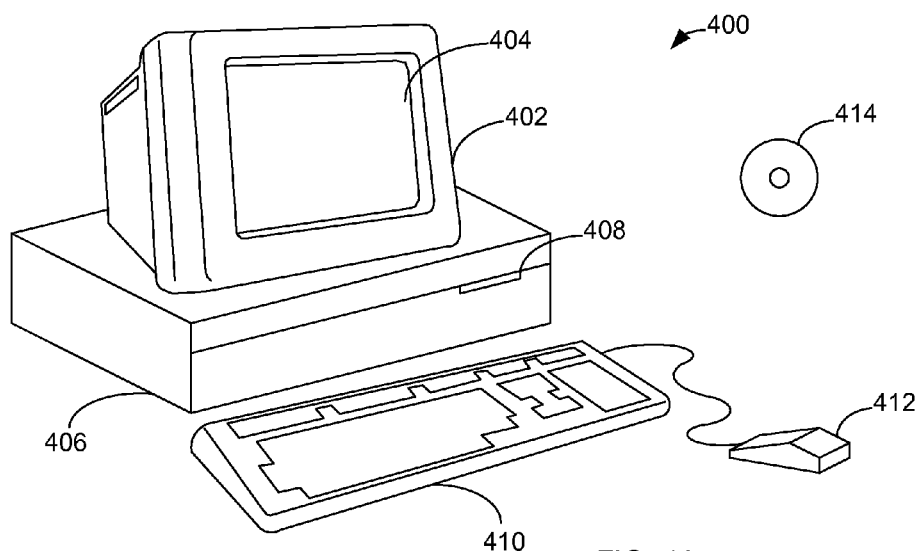
FIGS. 4A-B are schematic views of a computer system that may be used in practicing the invention.
Figure 4B:
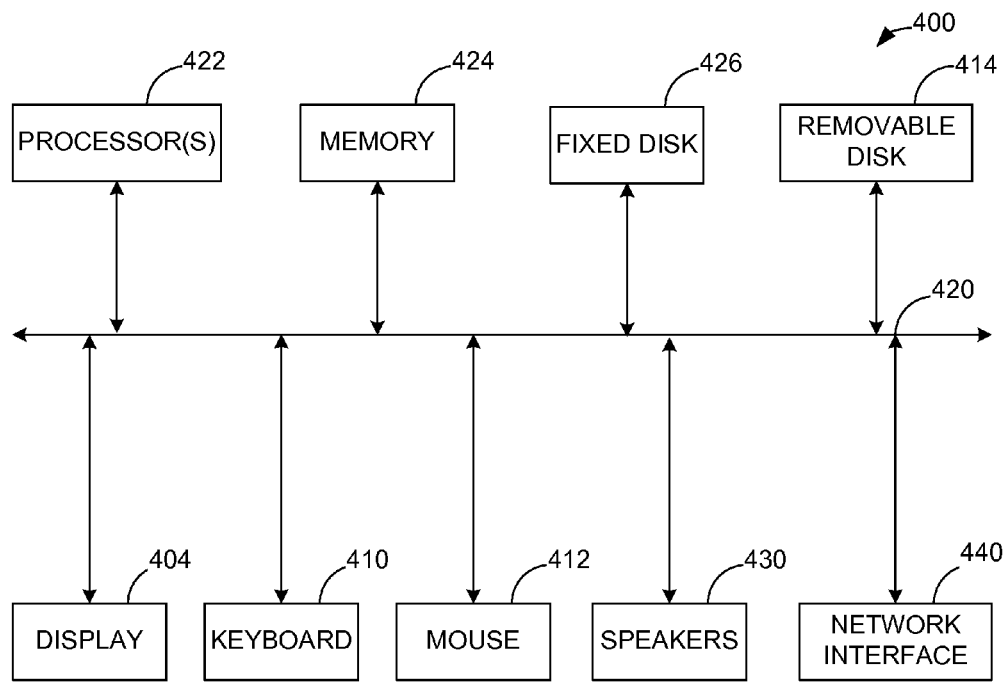

FIGS. 4A and 4B illustrate a computer system 400, which is suitable for using as a controller for the processing tool. Such a controller may be used to transport the substrates between different process chambers and to control the processes in the process chamber. FIG. 4A shows one possible physical form of a computer system that may be used for the controller 324. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk)

that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 may be also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 5:
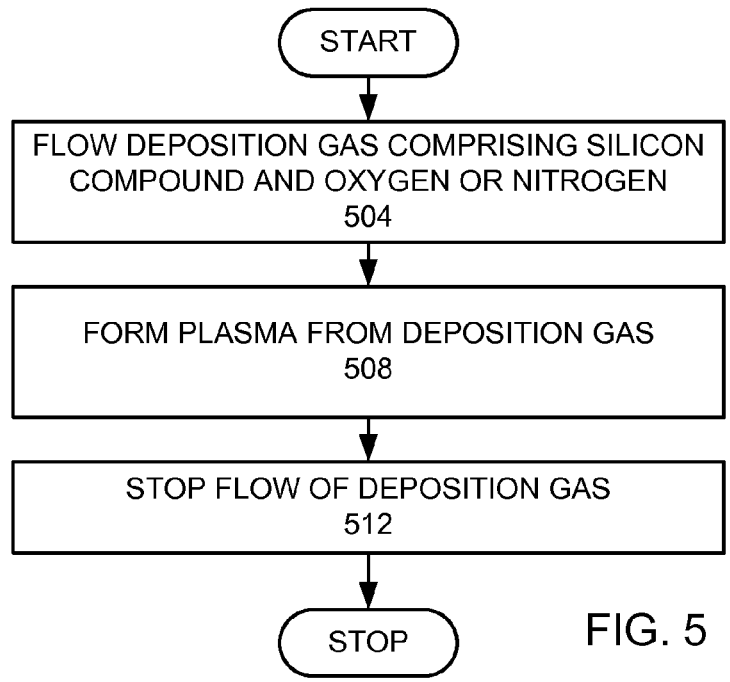
FIG. 5 is a more detailed flow chart of the sidewall deposition phase

The silicon layer is subjected to a gas modulated cyclical etch (step 112). The gas modulated cyclical etch comprises a plurality of cycles, where each cycle comprises a layer deposition phase (step 116) and an etch phase (step 120). FIG. 5 is a more detailed flow chart of the layer deposition phase. A deposition gas comprising a silicon containing compound (e.g. gaseous $SiF_4$, $SiH_4$, $SiCl_4$ etc) and oxygen, nitrogen, or $NO_x$, wherein x=1, 2 is flowed into the plasma processing chamber 304 (step 504). In this example, the deposition gas is 100 sccm $SiF_4$ and 160 sccm $O_2$. The deposition gas is formed into a plasma (step 508). The pressure is set at 50 mTorr. A power input of 2500 W of TCP at 13.56 MHz is provided. A bias voltage of 100 V is provided. After 0.6 seconds the flow of the deposition gas and the layer deposition phase are stopped (step 508). More generally, the deposition phase is between 0.1 seconds and 2 seconds.

Figure 2B:
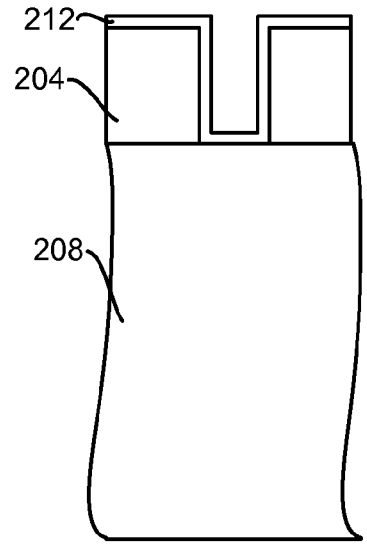

Without being limited by speculation, it is believed that the combination of a SiF4 and oxygen forms a silicon oxide ($SiO_x$) or silicon oxiflouride ($SiO_xF_y$) layer on the sidewalls of etched silicon features, where silicon from the etch gas chemistry and oxygen form to make silicon oxide, which is deposited on the sidewalls of etch features and on the photoresist mask 204. The silicon containing compound mixed with oxygen and nitrogen and/or $NO_x$(x=1 to 2) forms silicon oxynitride, which is deposited on the sidewalls of the etched silicon features and on the photoresist mask 204. A combination of a silicon containing gas species and nitrogen forms silicon nitride, which is deposited on the sidewalls of the etched features of the silicon and on the photoresist mask 204. FIG. 2B shows a silicon oxide deposition layer 212 formed on the photoresist mask 204 after the completion of the first deposition phase. It should be noted that such drawings are not to scale. The deposition layer may be much thinner than shown, but is drawn so that the deposition layer can be clearly seen.

Figure 6:
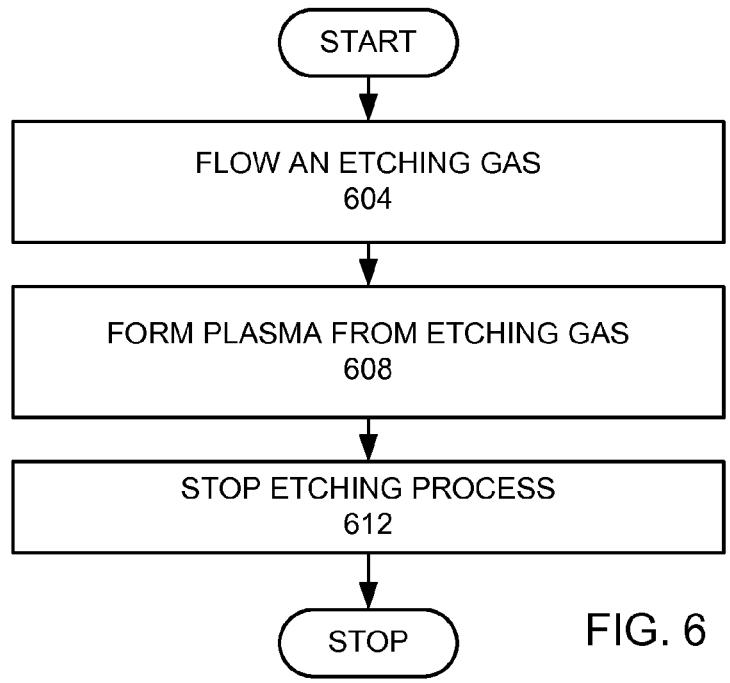
FIG. 6 is a more detailed flow chart of the etch phase.

FIG. 6 is a more detailed flow chart of the etch phase (step 120). An etch gas comprising a halogen component is flowed into the plasma processing chamber 304 (step 604). In this example, the gas is 1200 sccm $SF_6$. The etch gas is formed into a plasma (step 608). The pressure is set at 80 mTorr. A power input of 2500 W of TCP at 13.56 MHz is provided. A bias voltage of 100 V is provided. After 1.2 seconds the flow of the etch gas and the etch phase are stopped (step 612). More generally, the etch phase may be from 0.6 seconds to 10 seconds. Preferably, the etch phase is several times longer than the deposition phase.

In a preferred embodiment of the invention the silicon containing compound is at least one of the $SiF_4$, $SiH_4$, $SiCl_4$, $SiH_xCl_y$(x+y=4)), or $SiH_xF_y$. Preferably, the silicon containing compound may be a silane gas. The preferable halogen component is fluorine since it provides higher silicon removal rate. More preferably, the etching gas further comprises oxygen, nitrogen, or $NO_x$, wherein x=1, 2. Preferably, the ratio of the silicon containing compound to oxygen, nitrogen or $NO_x$ is between 1:1 to 30:1 by volume. More preferably, the ratio of silicon containing compound to oxygen, nitrogen or $NO_x$ is between 2:1 to 20:1.

Figure 2C:
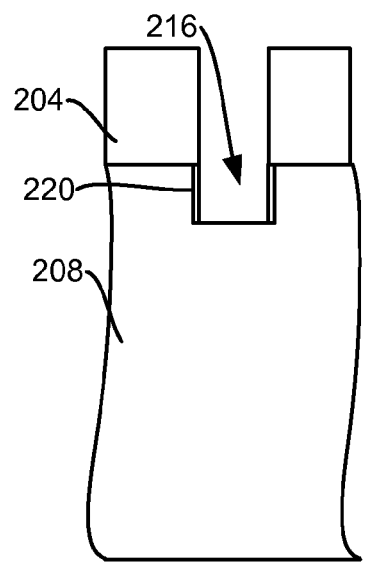

By providing oxygen, nitrogen, or $NO_x$ in the etchant gas in this embodiment a passivation layer may be formed with the silicon sidewalls during the etch. In this case though the SiOx layer generation rate is slower. The preferable method for depositing the thin film layer ($SiO_x$ or $SiO_xF_y$) is growing from the silicon source. FIG. 2C shows a partially etched feature 216, where sidewalls 220 have been formed during the etch phase. In this example the deposition layer from the deposition phase has been etched away. In other embodiments, some of the deposition layer may remain.

In another embodiment of the invention, the etch gas comprises a halogen compound and is oxygen and nitrogen free. More preferably, the etch gas consists essentially of a halogen compound. A specific example of the embodiment uses a recipe of 600 sccm $SF_6$. In this example, the $SF_6$ etches the silicon purely isotropically. This provides a more effective and better process window for a higher aspect ratio scheme.

Figure 2D:
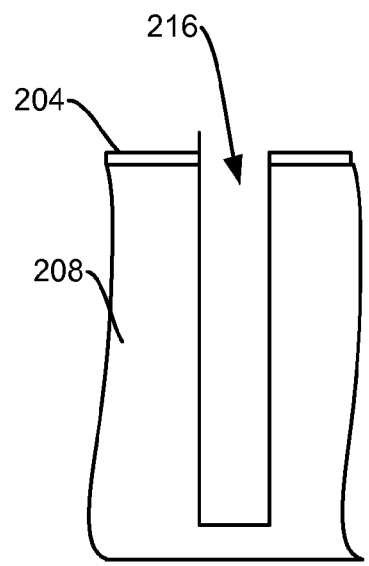

This process is continued for at least 10 cycles, until the silicon wafer is etched to the preferable etch depth, as shown in FIG. 2D. A subsequent back grinding process 124 may be used to remove part of the wafer so that the via passes through the wafer.

The silicon oxide or silicon nitride sidewall passivation layer used in the invention has been found to be more etch resistant. It has been found that an embodiment of the invention provides improved profile control by eliminating undercutting, bowing, and reducing taper. It has been found that performing the steps simultaneously does not provide the desired control, undercut and bowing being larger in that case. Therefore, such steps are performed sequentially. In addition to the improved profile, the passivation layer being stronger than the regular polymeric layer created by the Bosch process allows the use of a more aggressive and faster etch. In another scheme of the current process presented here, addition of an oxygen or nitrogen component during etching allows the formation of a passivation layer during etching, which allows for a thinner passivation layer to be formed during the deposition phase.

The deposition gas and the etching gas are different. Preferably, the deposition gas is halogen free. Preferably, the etching gas does not contain a silicon containing gas, such as silane. The etching gas and deposition gas are not mixed, which has been found to provide increased control.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching features into a silicon substrate disposed below a mask in a plasma processing chamber, comprising:
    etching the silicon substrate through the mask comprising a plurality of cycles, wherein each cycle comprises:
    a sidewall inorganic deposition phase, comprising
    providing a flow of sidewall deposition phase gas comprising a silicon containing compound gas and at least one of oxygen, nitrogen or $NO_x$, wherein x=1, 2 into the plasma processing chamber;
        forming a plasma from the sidewall deposition phase gas in the plasma processing chamber; and
        stopping the flow of the sidewall deposition gas into the plasma processing chamber; and
    an etch phase, comprising;
        providing a flow of an etching gas comprising a halogen component into the plasma processing chamber;
        forming a plasma from the etching gas in the plasma processing chamber; and
        stopping the flow of the etching gas into the plasma processing chamber.

2. The method, as recited in claim 1, wherein the etching gas further comprises oxygen, nitrogen, or $NO_x$.

3. The method, as recited in claim 2, wherein each sidewall deposition phase is between 0.1 seconds and 2 seconds.

4. The method, as recited in 3, wherein each etch phase is between 0.6 seconds and 10 seconds.

5. The method, as recited in claim 4, wherein the halogen component is $SF_6$.

6. The method, as recited in claim 4, wherein the mask is a photoresist mask through which the silicon is etched during the etch;
    and wherein
    the etching of the silicon substrate through the mask forms a feature in the silicon substrate such that the feature has a sidewall; and
    the sidewall inorganic deposition phase comprises forming a passivation layer on the trench sidewall; and
    the plurality of cycles comprises an alternating pattern of deposition phase and etch phase.

7. The method, as recited in claim 6, wherein the silicon containing compound gas is selected from the group consisting of $SiF_4$, $SiCl_4$, $SiH_4$, $SiH_xCl_y(x+y=4)$, and $SiH_xF_y$.

8. The method, as recited in claim 4, wherein the deposition phase gas has a flow ratio of the silicon containing compound gas to oxygen, nitrogen or NO of between 1:1 to 30:1.

9. The method, as recited in claim 1, wherein the deposition gas and the etch gas are different and the deposition gas and the etch gas are not mixed.

10. The method, as recited in claim 1, wherein the sidewall deposition phase gas comprise a silicon containing compound and $NO_x$, wherein x=1, 2.

11. The method, as recited in claim 1, wherein the deposition phase gas is halogen free.

12. The method, as recited in claim 11, wherein the etch phase is free of the silicon containing compound gas.

13. The method, as recited in claim 1, wherein the deposition phase gas has a flow ratio of the silicon containing compound gas to oxygen, nitrogen or NO of between 1:1 to 30:1.

14. The method, as recited in claim 1, wherein the plurality of cycles is at least 10 cycles.

15. The method, as recited in claim 1, wherein the halogen component comprises fluorine.

16. The method, as recited in claim 1, wherein the halogen component is $SF_6$.

17. The method, as recited in claim 1, wherein during the etch phase a component comprising oxygen or nitrogen is added.

18. The method, as recited in claim 1, wherein the silicon containing compound gas is selected from the group consisting of $SiH_4$.

19. A method for etching features into a silicon substrate disposed below a mask in a plasma processing chamber, comprising:
    etching the silicon substrate through the mask comprising at least 10 cycles, wherein each cycle comprises:
    a sidewall inorganic deposition phase, comprising
        providing a flow of sidewall deposition phase gas comprising a silane gas and at least one of oxygen, nitrogen or $NO_x$, wherein x=1, 2 into the plasma processing chamber;
        forming a plasma from the sidewall deposition phase gas in the plasma processing chamber; and
        stopping the flow of the sidewall deposition gas into the plasma processing chamber; and
    an etch phase, comprising;
        providing a flow of an etching gas comprising $SF_6$ into the plasma processing chamber;
        forming a plasma from the etching gas in the plasma processing chamber; and
        stopping the flow of the etching gas into the plasma processing chamber.

20. The method, as recited in claim 19, wherein the etching gas further comprises oxygen, nitrogen, or NOx.

* * * * *